(12) United States Patent
Jang et al.

(10) Patent No.: US 12,401,324 B2
(45) Date of Patent: Aug. 26, 2025

(54) POWER SUPPLY SWITCH CIRCUIT AND OPERATING METHOD THEREOF

(71) Applicant: SAMSUNG ELECTRO-MECHANICS CO., LTD., Suwon-si (KR)

(72) Inventors: Youngwong Jang, Suwon-si (KR); Jeonghoon Kim, Suwon-si (KR); Jongok Ha, Suwon-si (KR); Shinichi Iizuka, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 669 days.

(21) Appl. No.: 17/862,511

(22) Filed: Jul. 12, 2022

(65) Prior Publication Data

US 2023/0111377 A1  Apr. 13, 2023

(30) Foreign Application Priority Data

Oct. 12, 2021 (KR) .................. 10-2021-0135175

(51) Int. Cl.
*H03F 1/30* (2006.01)
*H03F 1/02* (2006.01)
*H03F 3/24* (2006.01)

(52) U.S. Cl.
CPC .......... *H03F 1/0227* (2013.01); *H03F 3/245* (2013.01); *H03F 2200/102* (2013.01); *H03F 2200/451* (2013.01)

(58) Field of Classification Search
CPC ................ H03F 1/30; H03F 3/20; H03G 3/30
USPC ........................................ 330/297, 296, 285
See application file for complete search history.

(56) References Cited

U.S. PATENT DOCUMENTS

| 7,973,595 B2 | 7/2011 | Kimura |
| 11,009,902 B1 | 5/2021 | Miwa et al. |
| 2020/0304018 A1 | 9/2020 | Chiang et al. |

FOREIGN PATENT DOCUMENTS

JP  6208504 B2  10/2017

*Primary Examiner* — Henry Choe
(74) *Attorney, Agent, or Firm* — NSIP Law

(57) ABSTRACT

A power supply switch circuit includes: a first switch to switch supply of a first power supply voltage to a power supply terminal of a power amplifier; a control voltage generator to generate a first control voltage through a charge pump operation, and to control the charge pump operation by comparing the first power supply voltage to a first voltage, which is a voltage of the power supply terminal; and a switch controller to generate a switching driving signal to control the first switch using the first control voltage.

15 Claims, 11 Drawing Sheets

FIG. 4

| bit2 | bit1 | $V_{SW1}$ | $V_{SW2}$ | SW1 | SW2 |
|---|---|---|---|---|---|
| 0 | 0 | OFF | OFF | OFF | OFF |
| 0 | 1 | OFF | ON | OFF | ON |
| 1 | 0 | ON | OFF | ON | OFF |
| 1 | 1 | OFF | OFF | OFF | OFF |

FIG. 10

| bit2 | bit1 | $V_{LOG2}$ | $V_{LOG1}$ |
|------|------|------------|------------|
| 0 | 0 | 1 | 1 |
| 0 | 1 | 1 | 0 |
| 1 | 0 | 0 | 1 |
| 1 | 1 | 1 | 1 | exercise
POWER SUPPLY SWITCH CIRCUIT AND OPERATING METHOD THEREOF

CROSS-REFERENCE TO RELATED APPLICATIONS

This application claims priority to and the benefit under 35 USC 119(a) of Korean Patent Application No. 10-2021-0135175 filed in the Korean Intellectual Property Office on Oct. 12, 2021, the entire contents of which are incorporated herein by reference for all purposes.

BACKGROUND

Field

The following description relates to a power supply switch circuit and an operation method thereof.

Description of the Background

As wireless communication standards evolve, a plurality of communication standards such as 2G, Wi-Fi, Bluetooth, 3G, 4G, and 5G are used in a single device (e.g., a smartphone). As a plurality of communication standards are used in one device, a power amplifier that outputs a transmission signal is also used for each communication standard. That is, in order to output a signal conforming to the plurality of communication standards, a plurality of power amplifiers corresponding to the plurality of communication standards may be required.

The power amplifier operates by receiving power supply from the outside, and in general, a separate power supply integrated circuit (IC) that supplies power to a single power amplifier is used. For example, four power supply ICs are used to operate four power amplifiers. When one communication standard among the plurality of communication standards is used, the other communication standards may not be simultaneously used. For example, when the 4G communication standard is used, the 3G communication standard may not be used. Accordingly, a power supply IC corresponding to an unused communication standard needs to be effectively used for another communication standard.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power supply switch circuit includes: a first switch configured to switch supply of a first power supply voltage to a power supply terminal of a power amplifier; a control voltage generator configured to generate a first control voltage through a charge pump operation, and to control the charge pump operation by comparing the first power supply voltage to a first voltage, which is a voltage of the power supply terminal; and a switch controller configured to generate a switching driving signal to control the first switch using the first control voltage.

The power supply switch circuit may include a second switch configured to switch supply of a second power supply voltage to the power supply terminal. The control voltage generator may be configured to generate a second control voltage through a second charge pump operation, and to control the second charge pump operation by comparing the second power supply voltage to the first voltage, and the switch controller may be configured to generate a second switching driving signal to control the second switch using the second control voltage.

The control voltage generator may include: a comparator configured to compare the first power supply voltage to the first voltage; an oscillator configured to generate a waveform corresponding to an enable signal of the first switch and an output of the comparator; and a charge pump configured to receive the first power supply voltage and a second voltage, and to generate the first control voltage by operating with the waveform.

The power supply switch circuit may include a counter configured to count a number of clocks of the waveform, and to output an enable signal to the comparator when the number of clocks satisfies a reference number. The comparator may be configured to determine whether a difference between the first power supply voltage and the first voltage is included within a set range when the enable signal of the counter is input.

The oscillator may be configured to stop generating the waveform when the comparator determines that the difference between the first power supply voltage and the first voltage is included within the set range.

The control voltage generator may include a NAND gate configured to receive the enable signal of the first switch and an output of the comparator, and the oscillator may be activated or deactivated corresponding to an output signal of the NAND gate.

The first control voltage may correspond to a sum of the first power supply voltage and the second voltage.

The switch controller may include a buffer circuit configured to receive the first control voltage and to generate the switching driving signal having the first control voltage.

The first power supply voltage may be fluctuated according to an envelope of a radio signal (RF) input to the power amplifier.

In another general aspect, an operation method of a power supply switch circuit that supplies at least one of a first power supply voltage and a second power supply voltage to a power supply terminal of a power amplifier by switching the at least one voltage includes: generating a first waveform corresponding to an enable signal with respect to a first switch that switches the first power supply voltage; generating a first control voltage by performing a charge pump operation through the first waveform; comparing the first power supply voltage to a first voltage, which is a voltage of the power supply terminal; stopping the generating of the first waveform corresponding to a result of the comparing; and generating a first switching driving signal that controls the first switch using the first control voltage.

The method may include counting a number of clocks with respect to the first waveform, and the comparing may include comparing the first power supply voltage to the first voltage when the number of clocks satisfies a reference number.

The stopping may include stopping generating the first waveform when a difference between the first power supply voltage and the first voltage is included within a set range.

The method may include: generating a second waveform corresponding to an enable signal with respect to a second switch that switches the second power supply voltage; generating a second control voltage by performing a second charge pump operation through the second waveform; comparing the second power supply voltage to the first voltage; stopping generating the second waveform corresponding to a result of the comparing between the second power supply voltage and the first voltage; and generating a second switching driving signal that controls the second switch using the second control voltage.

The first control voltage may be higher than the first power supply voltage, and the second control voltage may be higher than the second power supply voltage.

The first power supply voltage and the second power supply voltage may be fluctuated according to an envelope of a radio frequency (RF) signal input to the power amplifier.

Other features and aspects will be apparent from the following detailed description, the drawings, and the claims.

BRIEF DESCRIPTION OF THE DRAWINGS

FIG. 4 shows a logic table according to an example.

FIG. 10 shows an input-output logic table of the logic circuit of FIG. 9.

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

Figure 1:
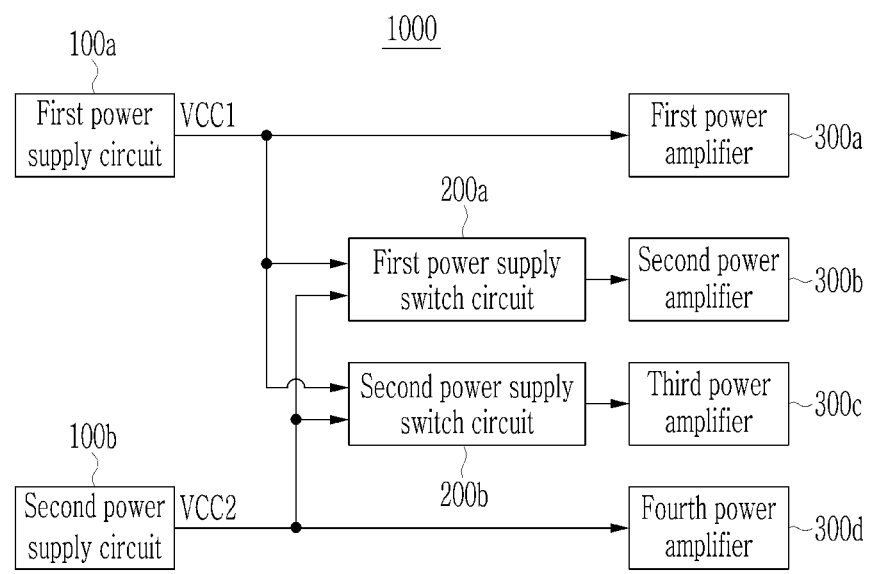
FIG. 1 is a block diagram of a transmission system according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Throughout the description, RF signals may have a format according to Wi-Fi (IEEE 802.11 family, etc.), WiMAX (IEEE 802.16 family, etc.), IEEE 802.20, LTE (long term evolution), EV-DO, HSPA, HSDPA, HSUPA, EDGE, GSM, GPS, GPRS, CDMA, TDMA, DECT, Bluetooth, 3G, 4G, 5G, and any other wireless and wired protocols designated thereafter, but is not limited thereto.

FIG. 1 is a block diagram of a transmission system 1000 according to an example.

As shown in FIG. 1, the transmission system 1000 may include first and second power supply circuits 100a and 100b, first and second power supply switch circuits 200a and 200b, and first, second, third, and fourth power amplifiers 300a, 300b, 300c, and 300d. FIG. 1 illustrates that the transmission system 100 is formed of four power amplifiers, and two power supply switch circuits are connected to the four power amplifiers, but the configuration is not limited thereto and the number of power amplifiers and the number of power supply switch circuits can be changed.

The first power supply circuit 100a generates and outputs a first power supply voltage VCC1. The first power supply voltage VCC1 may be applied to a power supply terminal of the first power amplifier 300a, the second power amplifier 300b, or the third power amplifier 300c. In order to support an average power tracking mode (APT mode), a value of the first power supply voltage VCC1 may be changed according to an envelope of a signal input to the first power amplifier 300a, the second power amplifier 300b, or the third power amplifier 300c.

The second power supply circuit 100b generates and outputs a second power supply voltage VCC2. The second power supply voltage VCC2 may be applied to a power supply terminal of the second power amplifier 300b, the third power amplifier 300c, or the fourth power amplifier 300d. In order to support the APT mode, a value of the second power supply voltage VCC2 may be changed according to an envelope of a signal input to the second power amplifier 300b, the third power amplifier 300c, or the fourth power amplifier 300d.

Each of the first and second power supply circuits 100a and 100b may be implemented as a power management (PM) IC.

The first power supply switch circuit 200a may receive the first power supply voltage VCC1 from the first power supply circuit 100a and may receive the second power supply voltage VCC2 from the second power supply circuit 100b. The first power supply switch circuit 200a may select one of the input first and second power supply voltages VCC1 and VCC2 and output the selected one to the power supply terminal of the second power amplifier 300b. For example, when the first power amplifier 300a does not operate, the first power supply switch circuit 200a may select the first power supply voltage VCC1 and output the first power supply voltage VCC1 to the power supply terminal of the second power amplifier 300b. In addition, when the fourth power amplifier 300d does not operate, the first power supply switch circuit 200a may select the second power supply voltage VCC2 and output the second power supply voltage VCC2 to the power supply terminal of the second power amplifier 300b.

The second power supply switch circuit 200b receives the first power supply voltage VCC1 from the first power supply circuit 100a and receives the second power supply voltage VCC2 from the second power supply circuit 100b. The second power supply switch circuit 200b may select one of the input first and second power supply voltages VCC1 and VCC2 and output the selected one to the power supply terminal of the third power amplifier 300c. For example, when the first power amplifier 300a does not operate, the second power supply switch circuit 200b may select the first power supply voltage VCC1 and output the first power supply voltage VCC1 to the power supply terminal of the third power amplifier 300c. In addition, when the fourth power amplifier 300d does not operate, the second power supply switch circuit 200b may select the second power supply voltage VCC2 and output the second power supply voltage VCC2 to the power supply terminal of the third power amplifier 300c.

The first power amplifier 300a operates by receiving the first power supply voltage VCC1 from the first power supply circuit 100a, and amplifies and outputs an input radio frequency (RF) signal. The input RF signal of the first power amplifier 300a may be an RF signal for a first communication standard.

The second power amplifier 300b operates by receiving the power supply voltage (i.e., the first power supply voltage VCC1 or the second power supply voltage VCC2) selected by the first power supply switch circuit 200a, and amplifies and outputs an input RF signal. The input RF signal of the second power amplifier 300b may be an RF signal for a second communication standard.

The third power amplifier 300c operates by receiving the power supply voltage (i.e., the first power supply voltage VCC1 or the second power supply voltage VCC2) selected by the second power supply switch circuit 200b, and amplifies and outputs the input RF signal. The input RF signal of the third power amplifier 300c may be an RF signal for a third communication standard.

The fourth power amplifier 300d operates by receiving the second power supply voltage VCC2 supplied from the second power supply circuit 100b, and amplifies and outputs an input RF signal. The input RF signal of the fourth power amplifier 300d may be an RF signal for a fourth communication standard.

The first to fourth communication standards may be different from each other, and may be any one of 2G, WiFi, Bluetooth, 3G, 4G, and 5G communication standards. The first to fourth communication standards may be communication standards that define different bands among 5G communication standards.

According to such a configuration, the number of power supply circuits can be reduced by sharing the power supply voltage through the power supply switch circuit. In general, when there are four power amplifiers, four power supply circuits are used, but in FIG. 1, the number of power supply circuits can be reduced to two by using a power supply switch circuit. Hereinafter, a detailed configuration and operation method of a power supply switch circuit such as the first and second power supply switch circuits 200a and 200b will be described.

Figure 2:
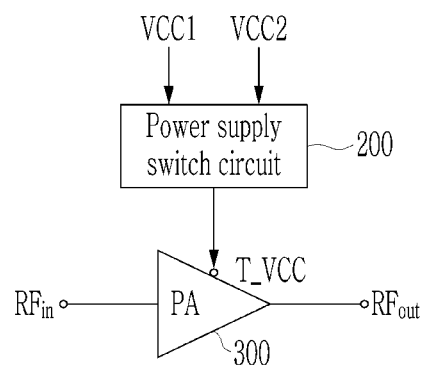
FIG. 2 shows a connection relationship between the power supply switch circuit and the power amplifier according to an example.

FIG. 2 shows a connection relationship between the power supply switch circuit 200 and the power amplifier 300 according to the example.

The power supply switch circuit 200 receives the first power supply voltage VCC1 and the second power supply voltage VCC2, and selects and outputs one of the first and second power supply voltages VCC1 and VCC2 to a power supply terminal T_VCC of the power amplifier 300. The power supply switch circuit 200 may be the first power supply switch circuit 200a or the second power supply switch circuit 200b of FIG. 1.

In FIG. 1 and FIG. 2, the power supply switch circuit 200 receives two power supply voltages, but the power supply switch circuit 200 may receive at least two power supply voltages. In this case, the power supply switch circuit 200 may select one power supply voltage among at least two power supply voltages.

The power amplifier 300 includes an input terminal $RF_{in}$, an output terminal $R_{out}$, and a power supply terminal T_VCC. The RF signal is input to the input terminal $RF_{out}$, and the amplified signal is output to the output terminal $RF_{out}$. A power supply voltage (VCC1 or VCC2) is applied to the power supply terminal T_VCC, and the power amplifier 300 is operated by the applied power supply voltage (VCC1 or VCC2). The power amplifier 300 may be implemented as a transistor. When the power amplifier 300 is implemented as a bipolar junction transistor (BJT), the input terminal $RF_{in}$ may be a base and the power supply terminal T_VCC may be a collector or an emitter. When the power amplifier 300 is implemented as a field effect transistor (FET), the input terminal $RF_{in}$ may be a gate and the power supply terminal T_VCC may be a drain or a source.

The power supply switch circuit 200 and the power amplifier 300 of FIG. 2 may be combined to implement a single power amplifier module.

Figure 3:
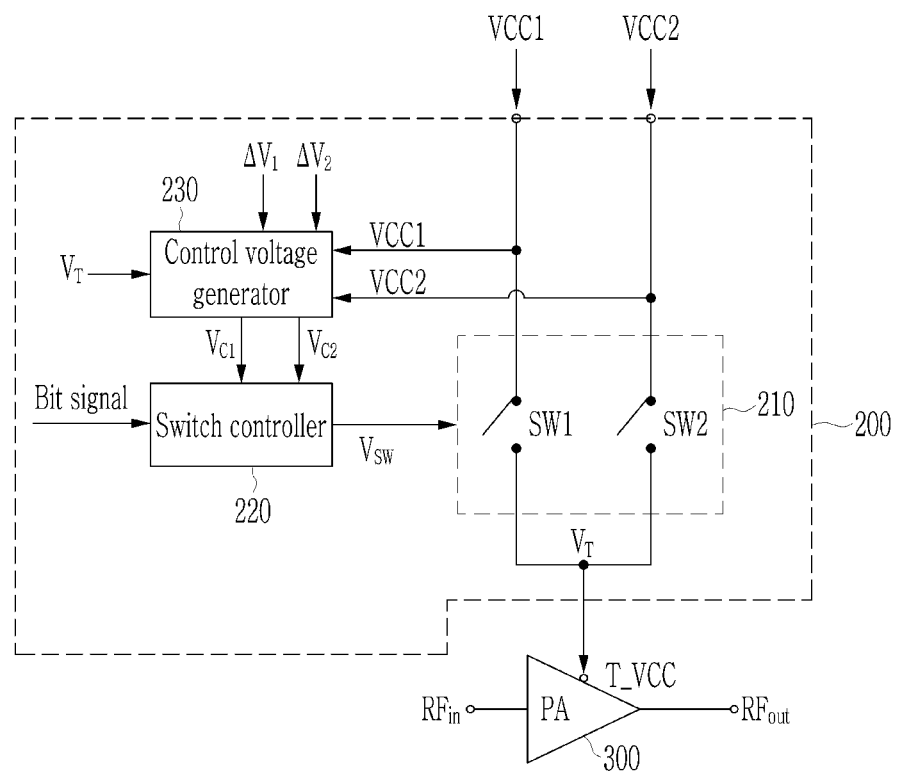
FIG. 3 shows an internal configuration of the power supply switch circuit of FIG. 2.

FIG. 3 shows an internal configuration of the power supply switch circuit 200 of FIG. 2.

As shown in FIG. 3, the power supply switch circuit 200 may include a switch circuit 210, a switch controller 220, and a control voltage generator 230.

The switch circuit 210 may include a first switch SW1 and a second switch SW2. The first switch SW1 may switch the supply of the first power supply voltage VCC1 to the power supply terminal T_VCC of the power amplifier 300, and the second switch SW2 may switch the supply of the second power supply voltage VCC2 to the power supply terminal T_VCC of the power amplifier 300. The first switch SW1 may be connected between the first power supply circuit 100a and the power supply terminal T_VCC of the power amplifier 300, and the second switch SW2 may be connected between the second power supply circuit 100b and the power supply terminal T_VCC of the power amplifier 300. In FIG. 3, a voltage of the power supply terminal T_VCC is denoted as $V_T$, and hereinafter, the voltage of the power supply terminal T_VCC will be called a power supply terminal voltage $V_T$.

The switch controller 220 may receive a bit signal (digital signal) from the outside and may generate a switching driving signal $V_{SW}$ for switching the switch circuit 210 in response to the input bit signal. The generated switching driving signal $V_{SW}$ is output to the switch circuit 210. Here, as an example, a bit signal input from the outside may be 2 bits. The switching driving signal $V_{SW}$ may include a first switching driving signal $V_{SW1}$ controlling the first switch SW1 and a second switching driving signal $V_{SW2}$ controlling the second switch SW2. The switch controller 220 receives the first control voltage $V_{C1}$ from the control voltage generator 230 as an input, and may generate the first switching driving signal $V_{SW1}$ by using the first control voltage $V_{C1}$. In addition, the switch controller 220 receives a second control voltage $V_{C2}$ from the control voltage generator 230 as an input, and may generate the second switching driving signal $V_{SW2}$ by using the second control voltage $V_{C2}$.

When the first switching driving signal $V_{SW1}$ is an ON driving signal and the second switching driving signal $V_{SW2}$ is an OFF driving signal, the first switch SW1 is turned on and the second switch SW2 is turned off. Accordingly, the first power supply voltage VCC1 is applied to the power supply terminal T_VCC of the power amplifier 300 through the first switch SW1.

When the first switching driving signal $V_{SW1}$ is an OFF driving signal and the second switching driving signal $V_{SW2}$ is an ON driving signal, the first switch SW1 is turned off and the second switch SW2 is turned on. Accordingly, the second power supply voltage VCC2 is applied to the power supply terminal T_VCC of the power amplifier 300 through the second switch SW2.

FIG. 4 shows a logic table according to the example.

In FIG. 4, bit1 and bit2 denote external bit signals input to the switch controller 220. As shown in FIG. 4, when the external bit signal is 00 and 11, both the first and second switching driving signals $V_{SW1}$ and $V_{SW2}$ may be OFF driving signals, and the first and second switches SW1 and SW2 may both be in a turn-off state. The switch controller 220 may include a logic circuit having a logic table such as shown in FIG. 4, which will be described in more detail below.

As shown in FIG. 3, the control voltage generator 230 receives the first power supply voltage VCC1 from the first power supply circuit 100a, and receives the second power supply voltage VCC2 from the second power supply circuit 100b. In addition, the control voltage generator 230 receives a first excessive voltage $\Delta V_1$, a second excessive voltage $\Delta V_2$, and a power supply terminal voltage $V_1$. The control voltage generator 230 generates the first control voltage $V_{C1}$ by using the first power supply voltage VCC1, the first excessive voltage $\Delta V_1$, and the power supply terminal voltage $V_1$. The control voltage generator 230 generates the second control voltage $V_{C2}$ by using the second power supply voltage VCC2, the second excessive voltage $\Delta V_2$, and the power supply terminal voltage $V_1$. The first and second control voltages $V_{C1}$ and $V_{C2}$ generated by the control voltage generator 230 are input to the switch controller 220. The first control voltage $V_{C1}$ may be a control voltage (e.g., a gate voltage) for switching the first switch SW1, and the second control voltage $V_{C2}$ may be a control voltage (e.g., a gate voltage) for switching the second switch SW2.

Figure 5:
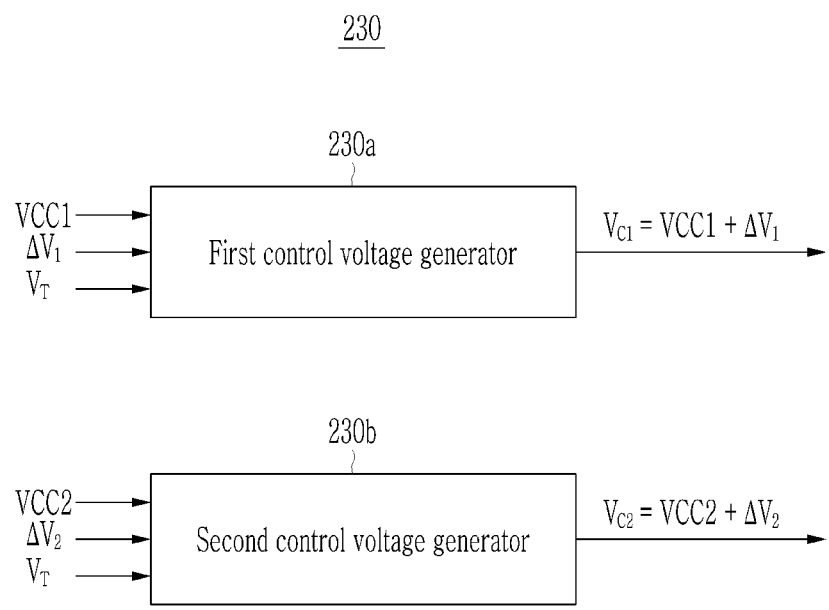
FIG. 5 shows the control voltage generator according to an example.

FIG. 5 shows the control voltage generator 230 according to the example.

As shown in FIG. 5, the control voltage generator 230 may include a first control voltage generator 230a and a second control voltage generator 230b.

The first control voltage generator 230a receives the first power supply voltage VCC1, the first excessive voltage $\Delta V_1$, and the power supply terminal voltage $V_1$, and generates the first control voltage $V_{C1}$ using the received voltages. In more detail, the first control voltage generator 230a generates the first control voltage $V_{C1}$ by operating an internal charge pump when an enable signal of the first switch SW1 is input. In addition, the first control voltage generator 230a may reduce current consumption by operating the charge pump on an internal counter for a predetermined time. Here, the first control voltage $V_{C1}$ may be the sum (VCC1+$\Delta V_1$) of the first power supply voltage VCC1 and the first excessive voltage $\Delta V_1$. The first excessive voltage $\Delta V_1$ is an arbitrarily set voltage, and may be 3 V as an example. The first excessive voltage $\Delta V_1$ may be implemented through a regulator such as a low dropout (LDO).

The second control voltage generator 230b receives the second power supply voltage VCC2, the second excessive voltage $\Delta V_2$, and the power supply terminal voltage $V_1$, and generates a second control voltage $V_{C2}$ using the received voltages. In more detail, the second control voltage generator 230b generates the second control voltage $V_{C2}$ by operating the internal charge pump when an enable signal of the second switch SW2 is input. In addition, the second control voltage generator 230b may reduce current consumption by operating the charge pump on an internal counter for a predetermined time. Here, the second control voltage $V_{C2}$ may be the sum (VCC2+$\Delta V_2$) of the second power supply voltage VCC2 and the second excessive voltage $\Delta V_2$. The second excessive voltage $\Delta V_2$ is an arbitrarily set voltage, and may be 3 V as an example. The second excessive voltage $\Delta V_2$ may also be implemented through a regulator such as an LDO. The second excessive voltage $\Delta V_2$ may be the same as the first excessive voltage $\Delta V_1$.

Figure 6A:
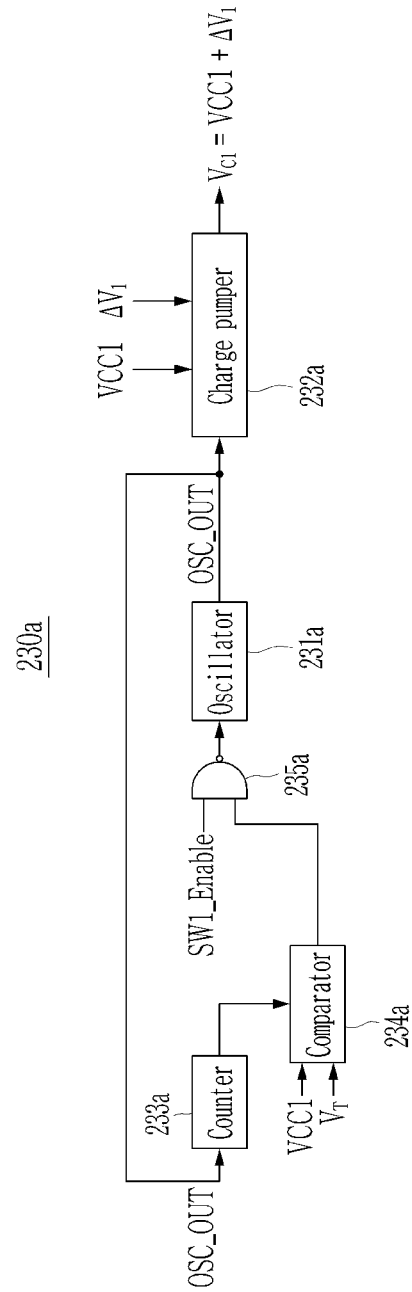
FIG. 6A shows an internal configuration of the first control voltage generator according to an example.
Figure 6B:
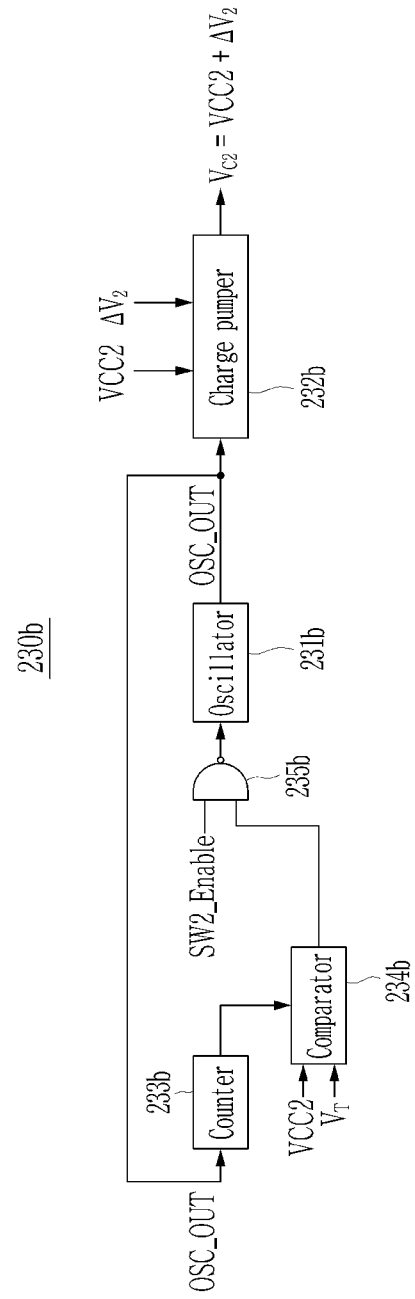
FIG. 6B shows an internal configuration of the second control voltage generator according to an example.

FIG. 6A shows an internal configuration of the first control voltage generator 230a according to the example, and FIG. 6B shows an internal configuration of the second control voltage generator 230b according to the example.

As shown in FIG. 6A, the first control voltage generator 230a may include an oscillator 231a, a charge pump 232a, a counter 233a, and a comparator 234a.

The oscillator 231a is activated when an enable signal SE1_Enable of the first switch is input, and may generate a square wave. The square wave generated by the oscillator 231a may be a clock signal. That is, when a turn-on signal of the first switch SW1 is input, the oscillator 231a may be activated to generate a square wave. Here, the enable signal SW1_Enable of the first switch may be bit 1, which is a bit signal for controlling the first switch SW1. In FIG. 6A, an output signal of the oscillator 231a is denoted as "OSC_OUT". On the other hand, as described below, the oscillator 231a may be deactivated in response to an output of the comparator 234a and stop generating the square wave.

The charge pump 232a receives an output signal OSC_OUT of the oscillator 231a and receives the first power supply voltage VCC1 and the first excessive voltage $\Delta V_1$. When a square wave is input from the oscillator 231a, the charge pump 232a operates. Accordingly, the charge pump 232a outputs a voltage that corresponds to the sum (VCC1+$\Delta V_1$) of the first power supply voltage VCC1 and the first excessive voltage $\Delta V_1$ as the first control voltage $V_{C1}$. Here, the charge pump 232a continues the charge pumping operation until a power terminal voltage (VT) becomes a voltage similar to the first power supply voltage VCC1. A method for the charge pump 233a to generate the first control voltage $V_{C1}$ using the first power supply voltage VCC1, the first excessive voltage $\Delta V_1$, and the square wave input from the oscillator 231a may be a conventional method.

Here, a relationship between the first control voltage $V_{C1}$ and the first power supply voltage VCC1 may satisfy the following Equation 1.

$$V_{C1} = VCC1 + \Delta V_1 \quad \text{(Equation 1)}$$

As shown in Equation 1, the first control voltage $V_{C1}$ may be set as a higher voltage than the first power supply voltage VCC1 by the first excessive voltage $\Delta V_1$.

The first control voltage $V_{C1}$ is a voltage used to switch the first switch SW1, and thus the first switch SW1 may be sufficiently turned on. For example, when the first switch SW1 is implemented as an N-type transistor, the voltage of the first switching driving signal $V_{SW1}$ must be set higher than the first power supply voltage VCC1 such that the first switch SW1 can sufficiently perform a turn-on operation. Accordingly, the first control voltage generator 230a according to the embodiment generates a first control voltage $V_{ci}$ that is higher than the first power supply voltage VCC1 and outputs it to the switch controller 220.

The counter 233a receives an output signal OSC_OUT of the oscillator 231a and performs counting. That is, when the oscillator 231a outputs a square wave, the counter 233a outputs the number of times the square wave is clocked. A predetermined reference number is set inside the counter 233a. The counter 233a outputs an enable signal when the counted number of clocks becomes a predetermined reference number. In addition, the counter 233a outputs a disable signal until the counted clocks reach the predetermined reference number. Here, the predetermined reference number is a number preset by a designer, and may be set corresponding to the number of pumping times at which the charge pump 233a can sufficiently generate the first control voltage. For example, when the designer knows that the first control voltage $V_{C1}$ is sufficiently boosted with only 10 pumping operations of the charge pump 233a, the predetermined number of times can be set to 10.

The comparator 234a receives the output signal of the counter 233a as an input and performs an operation. When an enable signal is input from the counter 233a, the comparator 234a is activated to perform a comparison operation. In addition, when a disable signal is input from the counter 233a, the comparator 234a is deactivated and a comparison operation is not performed. The first power supply voltage VCC1 and the power terminal voltage $V_T$ to be compared are input to the comparator 234a, and the comparator 234a determines whether the first power supply voltage VCC1 and the power terminal voltage $V_T$ are similar to each other. When the difference between the first power supply voltage VCC1 and the power terminal voltage $V_T$ is within a predetermined range, the comparator 234a may determine them to be similar to each other. When the first power supply voltage VCC1 and the power terminal voltage $V_T$ are similar to each other, the comparator 234a outputs a high signal. When the first power supply voltage VCC1 and the power terminal voltage $V_T$ are not similar to each other, the comparator 234a outputs a low signal. When the first power supply voltage VCC1 and the power terminal voltage $V_T$ are similar to each other, it means that the first power supply voltage VCC1 is normally supplied to the power terminal T_VCC. A method for the comparator 234a to determine whether the two voltages VCC1 and $V_T$ are similar may be a conventional method.

The first control voltage generator 230a may further include a NAND gate 235a. The NAND gate 235a receives an enable signal SW1_Enable of the first switch and an output signal of the comparator 234a. An output signal of the NAND gate 235a is output to the oscillator 231a, and the oscillator 231a is activated corresponding to the output signal of the NAND gate 235a. When the output signal of the NAND gate 235a is a high signal, the oscillator 231a is activated. When the output signal of the NAND gate 235a is a low signal, the oscillator 231a is deactivated. The NAND gate 235a outputs a low signal only when both input signals (i.e., the enable signal SW1_Enable of the first switch and the output signal of the comparator 234a) are high signals. As described above, the comparator 234a outputs a high signal when the two voltages VCC1 and $V_T$ are similar. Accordingly, when the two voltages VCC1 and $V_T$ are similar to each other, the NAND gate 235a outputs a low signal, and the oscillator 231a is deactivated to stop generating a square wave. When the oscillator 231a stops generating a square wave, the charge pump 232a stops pumping.

Figure 7:
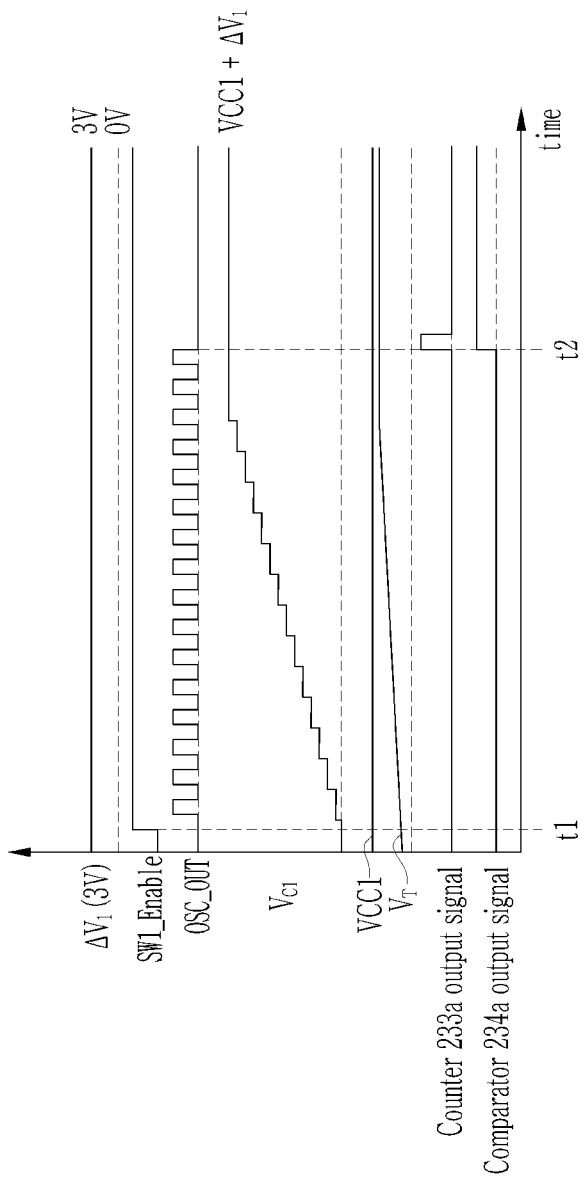
FIG. 7 shows an operation timing graph with respect to the first control voltage generator of FIG. 6A.

FIG. 7 shows an operation timing graph with respect to the first control voltage generator 230a of FIG. 6A.

At t1, the enable signal SW1_Enable of the first switch is changed from a low signal to a high signal. Accordingly, the oscillator 231a is activated and generates a square wave. The square wave (e.g., a clock signal) generated by the oscillator 231a is input to the charge pump 232a and the counter 233a.

In this time, the charge pump 232a performs a pumping operation and the counter 233a performs a counting operation. The charge pump 233a generates the first control voltage $V_{C1}$ that rises through the pumping operation, and the counter 233a counts the number of square waves of the oscillator 231a.

At time t2, the counter 233a outputs an enable signal. That is, the counter 233a outputs an enable signal when the counted number of clocks becomes a predetermined reference number. In this case, since the enable signal of the counter 233a is input to the comparator 234a, the comparator 234a is activated to perform a comparison operation. Meanwhile, between the time t1 and the time t2, the power terminal voltage $V_T$ gradually increases to reach near the first power supply voltage VCC1. At the time t2, the comparator 234a determines whether the first power supply voltage VCC1 and the power terminal voltage $V_T$ are similar to each other, and when they are similar, the comparator 234a outputs a high signal. The NAND gate 235a outputs a low signal by the high signal of comparator 234a, and the oscillator 231a is deactivated. Accordingly, at the time t2, the oscillator 231a stops generating the square wave.

In addition, the charge pump 232a continues the pumping operation from the time t1 and stops the pumping operation at the time t2. Since the charge pump 232a has performed a sufficient pumping operation before the time t2, the first control voltage $V_{C1}$ may be a voltage (VCC1+$\Delta V_1$) corresponding to the sum of the first power supply voltage VCC1 and the first excessive voltage $\Delta V_1$. Since the first control voltage $V_{C1}$ is used as a control voltage to turn on the first switch SW1, the first switch SW1 can be sufficiently turned on. Accordingly, a voltage substantially similar to the first power supply voltage VCC1 may be applied to the power terminal T_VCC.

As shown in FIG. 6B, a second control voltage generator 230b according to an example may include an oscillator 231b, a charge pump 232b, a counter 233b, a comparator 234b, and a NAND gate 235b.

Referring to FIG. 6A and FIG. 6B, an internal configuration of the second control voltage generator 230b is substantially to the same as that of the first control voltage generator 230a except for the following parts, and detailed description thereof will be omitted. The oscillator 231a generates a square wave when an enable signal SW2_Enable of the second switch is input. The charge pump 232b receives a second power supply voltage VCC2 and a second excessive voltage $\Delta V_2$, and outputs a voltage VCC2+$\Delta V_2$ corresponding to the sum of the second power supply voltage VCC2 and the second excessive voltage $\Delta V_2$ as the second control voltage $V_{C2}$. The second power supply voltage VCC2 and the power terminal voltage $V_T$ are input to the comparator 234b, and the comparator 234b determines whether the second power supply voltage VCC2 and the power terminal voltage $V_T$ are similar to each other. Then, the enable signal SW2_Enable of the second switch is input to the NAND gate 235b.

The relationship between the second control voltage $V_{C2}$ and the second power supply voltage $V_{C2}$ may satisfy Equation 2 below.

$$V_{C2} = VCC2 + \Delta V_2 \quad \text{(Equation 2)}$$

As shown in Equation 2, the second control voltage $V_{C2}$ may be set to a higher voltage than the second power supply voltage VCC2 by a second excessive voltage $\Delta V_2$. Since the second control voltage $V_{C2}$ is a voltage used to switch the second switch SW2, the second switch SW2 can be sufficiently turned on. For example, when the second switch SW2 is implemented as an N-type transistor, a voltage of the second switching driving signal $V_{SW2}$ must be set higher than the second power supply voltage VCC2 so that the second switch SW2 can sufficiently perform a turn-on operation. Accordingly, the second control voltage generator 230b generates a second control voltage $V_{C2}$ that is higher than the second power supply voltage VCC2 and outputs it to the switch controller 220.

Figure 8:
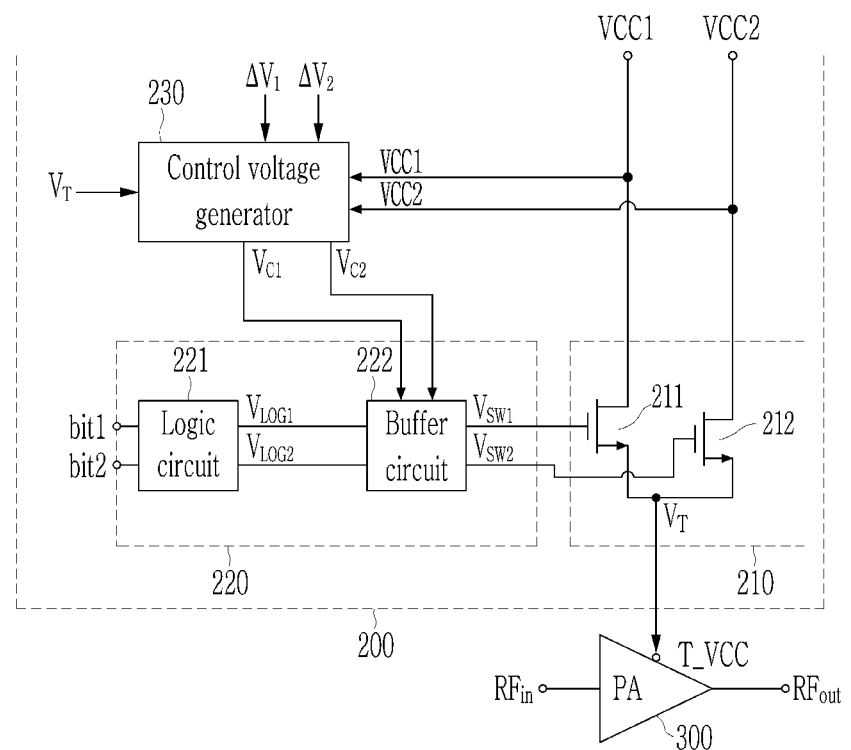
FIG. 8 shows an internal configuration of the switch circuit and an internal configuration of the switch controller according to an example.

FIG. 8 shows an internal configuration of the switch circuit 210 and an internal configuration of the switch controller 220 according to the example.

As shown in FIG. 8, the switch controller 220 may include a logic circuit 221 and a buffer circuit 222.

The logic circuit 221 receives external bit signals bit1 and bit2, and generates and outputs logic signals $V_{LOG1}$ and $V_{LOG2}$ in response to the bit signals bit1 and bit2. The first bit signal bit1 and the first logic signal $V_{LOG1}$ are used to control the first switch SW1, and the second bit signal bit2 and the second logic signal $V_{LOG2}$ are used to control the second switch SW2.

Figure 9:
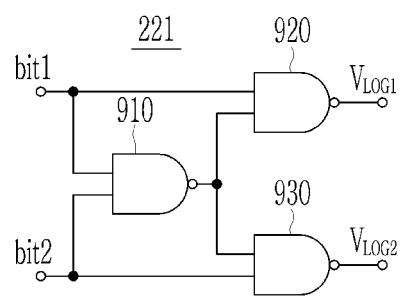
FIG. 9 shows the logic circuit according to an example.

FIG. 9 shows the logic circuit 221 according to the example.

As shown in FIG. 9, the logic circuit 221 may include a first NAND gate 910, a second NAND gate 920, and a third NAND gate 930.

The first NAND gate 910 receives the first bit signal bit1 and the second bit signal bit2. The second NAND gate 920 receives the first bit signal bit1 and the output of the first NAND gate 910, and outputs the first logic signal $V_{LOG1}$. Then, the third NAND gate 930 receives the second bit signal bit2 and the output of the first NAND gate 910, and outputs the second logic signal $V_{LOG2}$.

Figure 10:
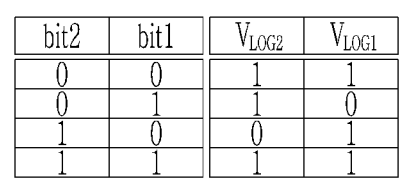

FIG. 10 shows an input-output logic table of the logic circuit 221 of FIG. 9.

As shown in FIG. 10, the logic circuit 221 may generate and output four states in response to two bit signals. When the first logic signal $V_{LOG1}$ is 1, it corresponds to a high level, and in this case, the first switch SW1 may be turned off. In addition, when the first logic signal $V_{LOG1}$ is 0, it corresponds to a low level, in this case, the first switch SW1 may be turned on. Accordingly, the first and second switches SW1 and SW2 are turned off at the high level of the first and second logic signals $V_{LOG1}$ and $V_{LOG2}$, and the first and second switches SW1 and SW2 are turned on at the low level of the first and second logic signals $V_{LOG1}$ and $V_{LOG2}$. That is, since the first logic signal $V_{LOG1}$ in bit signal 01 is at a low level, the first switch SW1 is turned on. In addition, in bit signal 10, since the second logic signal $V_{LOG2}$ is at a low level, the second switch SW2 is turned on. In the remaining cases, since the first and second logic signals $V_{LOG1}$ and $V_{LOG2}$ are at a high level, both the first and second switches SW1 and SW2 are turned off.

The buffer circuit 222 may receive the first and second logic signals $V_{LOG1}$ and $V_{LOG2}$ from the logic circuit 221, and may generate and output the switching driving signals $V_{SW1}$ and $V_{SW2}$. The buffer circuit 222 converts the first logic signal $V_{LOG1}$ into the first switching driving signal $V_{SW1}$ and converts the second logic signal $V_{LOG2}$ into the second switching driving signal $V_{SW2}$. Since the first logic signal $V_{LOG1}$ and the second logic signal $V_{LOG2}$ are logic signals, the current level is low. Accordingly, the buffer circuit 222 converts the first logic signal $V_{LOG1}$ and the second logic signal $V_{LOG2}$ into the first switching driving signal $V_{SW1}$ and the second switching driving signal $V_{SW2}$ having a high current level, respectively. The buffer circuit 222 may further include a level shifter circuit as well as a buffer to increase a voltage level as well as a current level.

The buffer circuit 222 receives the first control voltage $V_{C1}$ from the control voltage generator 230 and generates a first switching driving signal $V_{SW1}$ having a high voltage level by using the first control voltage $V_{C1}$. When the first switching driving signal $V_{SW1}$ has a high voltage level, the first switching driving signal $V_{SW1}$ may be the first control voltage $V_{C1}$. The buffer circuit 222 receives the second control voltage $V_{C2}$ from the control voltage generator 230 and generates a second switching driving signal $V_{SW2}$ having a high voltage level by using the second control voltage $V_{C2}$. When the second switching driving signal $V_{SW2}$ has a high voltage level, the second switching driving signal $V_{SW2}$ may be the second control voltage $V_{C2}$. In addition, when the first and second driving signals $V_{SW1}$ and $V_{SW2}$ have a low voltage level, the first and second driving signals $V_{SW1}$ and $V_{SW2}$ may have a ground voltage of 0 V or a negative (−) voltage. When the first and second switches SW1 and SW2 are implemented as N-type transistors, the buffer circuit 222 is an ON driving signal, and the first and second switching driving signals $V_{SW1}$ and $V_{SW2}$ each having first and second control voltages $V_{C1}$ and $V_{C2}$, respectively, can be output. A method for the buffer circuit 222 to generate the first and second switching driving signals $V_{SW1}$ and $V_{SW2}$ using the first and second control voltages $V_{C1}$ and $V_{C2}$ may be a conventional method.

As shown in FIG. 8, in the switch circuit 210, the first and second switches SW1 and SW2 may be respectively implemented as transistors 211 and 212. As an example, the transistor 211 may be implemented as an N-type field effect transistor (FET).

A first terminal (e.g., a drain terminal) of the transistor 211 is connected to the first power supply circuit 100a to receive the first power supply voltage VCC1 as input (supply), and a second terminal (e.g., a source terminal) of the transistor 211 is connected to the power supply terminal T_VCC. A control terminal (e.g., a gate terminal) of the transistor 211 receives the first switching driving signal $V_{SW1}$ from the buffer circuit 222. The first terminal of the transistor 212 is connected to the second power supply circuit 100b to receive (supply) the second power supply voltage VCC2, and the second terminal of the transistor 212 is connected to the power supply terminal T_VCC. The control terminal of the transistor 212 receives the second switching driving signal $V_{SW2}$ from the buffer circuit 222.

When the transistor 211 is an N-type transistor, the buffer circuit 220 may output a first control voltage $V_{C1}$ as the first switching driving signal $V_{SW1}$ for turn-on of the transistor 211. In addition, when the transistor 212 is an N-type transistor, the buffer circuit 220 may output a second control voltage $V_{C2}$ as the second switching driving signal $V_{SW2}$ for turn-on of the transistor 212. Through this, the N-type transistors 211 and 212 may be sufficiently turned on. When the control voltage of the N-type transistors 211 and 212 is lower than the voltage of the first terminal (e.g., the drain voltage) or the voltage of the second terminal (e.g., the source voltage), the N-type transistors 211 and 212 operated in a turn-off region such that ON resistance may be increased. To solve such a problem, the control voltage generator 230 generates first and second control voltages $V_{C1}$ and $V_{C2}$ that are higher than the first and second power supply voltages VCC1 and VCC2, respectively. The buffer circuit 222 generates first and second control voltages $V_{C1}$ and $V_{C2}$ as control voltages of the N-type transistors 211 and 212, respectively. That is, the first control voltage $V_{C1}$ may be an ON control voltage of the N-type transistor 211, and the second control voltage $V_{C2}$ may be an ON control voltage of the N-type transistor 212.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply switch circuit comprising:
   a first switch configured to switch supply of a first power supply voltage to a power supply terminal of a power amplifier;
   a control voltage generator configured to generate a first control voltage through a charge pump operation, and to control the charge pump operation by comparing the first power supply voltage to a first voltage, which is a voltage of the power supply terminal; and
   a switch controller configured to generate a switching driving signal to control the first switch using the first control voltage.

2. The power supply switch circuit of claim 1, further comprising a second switch configured to switch supply of a second power supply voltage to the power supply terminal,
   wherein the control voltage generator is configured to generate a second control voltage through a second charge pump operation, and to control the second charge pump operation by comparing the second power supply voltage to the first voltage, and
   the switch controller is configured to generate a second switching driving signal to control the second switch using the second control voltage.

3. The power supply switch circuit of claim 1, wherein the control voltage generator comprises:
   a comparator configured to compare the first power supply voltage to the first voltage;
   an oscillator configured to generate a waveform corresponding to an enable signal of the first switch and an output of the comparator; and
   a charge pump configured to receive the first power supply voltage and a second voltage, and to generate the first control voltage by operating with the waveform.

4. The power supply switch circuit of claim 3, further comprising a counter configured to count a number of clocks of the waveform, and to output an enable signal to the comparator when the number of clocks satisfies a reference number,
   wherein the comparator is configured to determine whether a difference between the first power supply voltage and the first voltage is included within a set range when the enable signal of the counter is input.

5. The power supply switch circuit of claim 4, wherein the oscillator is configured to stop generating the waveform when the comparator determines that the difference between the first power supply voltage and the first voltage is included within the set range.

6. The power supply switch circuit of claim 4, wherein
the control voltage generator further comprises a NAND gate configured to receive the enable signal of the first switch and an output of the comparator, and
the oscillator is activated or deactivated corresponding to an output signal of the NAND gate.

7. The power supply switch circuit of claim 3, wherein the first control voltage corresponds to a sum of the first power supply voltage and the second voltage.

8. The power supply switch circuit of claim 1, wherein the switch controller comprises a buffer circuit configured to receive the first control voltage and to generate the switching driving signal having the first control voltage.

9. The power supply switch circuit of claim 1, wherein the first power supply voltage is fluctuated according to an envelope of a radio signal (RF) input to the power amplifier.

10. An operation method of a power supply switch circuit that supplies at least one of a first power supply voltage and a second power supply voltage to a power supply terminal of a power amplifier by switching the at least one voltage, the method comprising:
generating a first waveform corresponding to an enable signal with respect to a first switch that switches the first power supply voltage;
generating a first control voltage by performing a charge pump operation through the first waveform;
comparing the first power supply voltage to a first voltage, which is a voltage of the power supply terminal;
stopping the generating of the first waveform corresponding to a result of the comparing; and
generating a first switching driving signal that controls the first switch using the first control voltage.

11. The operation method of claim 10, further comprising counting a number of clocks with respect to the first waveform,
wherein the comparing comprises comparing the first power supply voltage to the first voltage when the number of clocks satisfies a reference number.

12. The operation method of claim 10, wherein
the stopping comprises stopping generating the first waveform when a difference between the first power supply voltage and the first voltage is included within a set range.

13. The operation method of claim 10, further comprising:
generating a second waveform corresponding to an enable signal with respect to a second switch that switches the second power supply voltage;
generating a second control voltage by performing a second charge pump operation through the second waveform;
comparing the second power supply voltage to the first voltage;
stopping generating the second waveform corresponding to a result of the comparing between the second power supply voltage and the first voltage; and
generating a second switching driving signal that controls the second switch using the second control voltage.

14. The operation method of claim 13, wherein
the first control voltage is higher than the first power supply voltage, and the second control voltage is higher than the second power supply voltage.

15. The operation method of claim 13, wherein
the first power supply voltage and the second power supply voltage are fluctuated according to an envelope of a radio frequency (RF) signal input to the power amplifier.

* * * * *